United States Patent
Lee

(10) Patent No.: US 7,917,821 B2
(45) Date of Patent: Mar. 29, 2011

(54) SYSTEM-ON-CHIP PERFORMING MULTI-PHASE SCAN CHAIN AND METHOD THEREOF

(75) Inventor: Hoi-Jin Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 407 days.

(21) Appl. No.: 12/071,106

(22) Filed: Feb. 15, 2008

(65) Prior Publication Data
US 2008/0209290 A1 Aug. 28, 2008

(30) Foreign Application Priority Data
Feb. 23, 2007 (KR) .................. 10-2007-0018582

(51) Int. Cl.
*G01R 31/28* (2006.01)
(52) U.S. Cl. .......... 714/729; 714/30; 714/724; 714/731; 714/726; 714/727
(58) Field of Classification Search .................. None
See application file for complete search history.

(56) References Cited

U.S. PATENT DOCUMENTS

| | | | | |
|---|---|---|---|---|
| 4,864,579 A * | 9/1989 | Kishida et al. ................ | 714/726 |
| 4,894,830 A * | 1/1990 | Kawai ........................... | 714/731 |
| 4,914,379 A * | 4/1990 | Maeno .......................... | 714/731 |
| 6,327,684 B1 * | 12/2001 | Nadeau-Dostie et al. .... | 714/731 |
| 6,735,731 B2 | 5/2004 | Ewen et al. | |
| 6,904,553 B1 * | 6/2005 | Brown .......................... | 714/731 |
| 7,167,966 B2 * | 1/2007 | Cornelius et al. ............. | 711/167 |
| 7,401,277 B2 * | 7/2008 | Yamada et al. ............... | 714/726 |
| 7,624,322 B2 * | 11/2009 | Duggal et al. ................ | 714/731 |
| 2002/0138801 A1 * | 9/2002 | Wang et al. ................... | 714/729 |
| 2003/0145264 A1 * | 7/2003 | Siegel et al. .................. | 714/726 |
| 2004/0019830 A1 * | 1/2004 | Hosotani et al. ................ | 714/30 |
| 2004/0163021 A1 * | 8/2004 | Nadeau-Dostie ............. | 714/726 |
| 2004/0268181 A1 * | 12/2004 | Wang et al. ..................... | 714/30 |
| 2005/0235186 A1 * | 10/2005 | Wang et al. ................... | 714/728 |
| 2007/0255988 A1 * | 11/2007 | Wang et al. ................... | 714/726 |
| 2007/0288818 A1 * | 12/2007 | Wang ............................ | 714/726 |
| 2008/0010573 A1 * | 1/2008 | Sul ................................ | 714/731 |
| 2009/0070646 A1 * | 3/2009 | Wang et al. ................... | 714/728 |
| 2009/0132880 A1 * | 5/2009 | Wang et al. ................... | 714/731 |

FOREIGN PATENT DOCUMENTS

| | | |
|---|---|---|
| JP | 2004-233084 A | 8/2004 |
| JP | 2005-164437 | 6/2005 |
| KR | 10-1999-0088392 | 12/1999 |

* cited by examiner

Primary Examiner — John P Trimmings
(74) Attorney, Agent, or Firm — Lee & Morse, P.C.

(57) ABSTRACT

A system on chip (SOC) may include function blocks, and a scan chain in each of the function blocks, the scan chains being adapted to conduct scan test operations in sync with a respective one of a plurality of clock signals having a different phase relative to each other, wherein during an isolation mode, the scan chains test combination circuits of the function blocks, and during an interface mode, the scan chains of adjacent ones of the function blocks test combination circuits between the adjacent ones of the function blocks.

15 Claims, 7 Drawing Sheets

SYSTEM-ON-CHIP PERFORMING MULTI-PHASE SCAN CHAIN AND METHOD THEREOF

BACKGROUND OF THE INVENTION

1. Field of the Invention

Embodiments of the invention relate to digital circuit design. More particularly, embodiments relate to scan chains of digital circuits.

2. Description of the Related Art

Circuit technologies of design for testability (DFT) have been steadily advanced for efficiently testing integrated circuits. A scan test is widely used for testing digital circuits. The scan test is conducted by replacing normal flip-flops with scan flip-flops and forming one or more shift chains with the scan flip-flops. In the scan test mode, a testing operation is carried out by repeating three steps of shift input, parallel loading, and shift output.

There are two kinds of scan chains, i.e., single scan chain and multi-scan chain. The single scan chain is formed by arranging all scan flip-flops in one chain. The multi-scan chain is formed by arranging the scan flip-flops in a plurality of chains. The multi-scan chain is generally used more than the single scan chain because it is advantageous for reducing a size of scan test vector.

All scan flip-flops of a scan chain operate at the same time when the scan chain is being conductive. As a result of the simultaneous operation of all the scan flip flops in a scan chain, there may be a transient voltage drop at a power source voltage. Such a transient voltage drop affects operating times. For example, such a transient voltage drop increases a setup time and a hold time. A longer setup time can be repaired by reducing a clock speed. However, a longer hold time cannot be corrected even by adjusting the clock speed.

Therefore, it results in a fail due to the scan test vector.

SUMMARY OF THE INVENTION

Embodiments are therefore directed to scan chains of digital circuits that substantially overcome one or more of the problems due to the limitations and disadvantages of the related art.

It is therefore a feature of an embodiment of the invention to provide a scan chain system capable of repairing a fail due to a scan test vector.

It is therefore a separate feature of an embodiment of the invention to provide a system on chip (SOC) including a plurality of function blocks, each including a scan chain(s) for performing scan tests on each of the function blocks in sync with a respective one of a plurality of clock signals that are out-phase with each other. During an isolation mode, the respective scan chains may test combination circuits of each of the function blocks. During an interface mode, the scan chains of adjacent function blocks may be employed to test combination circuits between adjacent ones of the function blocks.

At least one of the above and other features and advantages of the invention may be realized by providing a system on chip (SOC), including function blocks, and a scan chain in each of the function blocks, the scan chains being adapted to conduct scan test operations in sync with a respective one of a plurality of clock signals having a different phase relative to each other, wherein during an isolation mode, the scan chains test combination circuits of the function blocks, and during an interface mode, the scan chains of adjacent ones of the function blocks test combination circuits between the adjacent ones of the function blocks.

The SOC may include a multi-phase clock generator adapted to sequentially generate the plurality of clock signals based on a system clock. The scan chain of each of the functional blocks may be adapted to operate in response to a respective one of the plurality of clock signals having a different phase. The scan chains may be multi-scan chains. Each of the function blocks includes a plurality of the scan chains. At least one of the plurality of scan chains of each function block may be adapted to test the combination circuit of the respective function block and the combination circuit adjacent to and outside of the respective function block.

The at least one scan chain of each function block may operate to test the combination circuit of the respective function block in response to a clock signal of a first phase and operates to test the combination circuit adjacent to and outside of the respective function clock in response to a clock signal of a second phase, wherein the first phase is different form the second phase. Each function block may be adapted to operate in an isolation mode and an interface mode based on a phase of a clock signal supplied thereto. The SOC may include a multiplexer adapted to selectively supply one of respective ones of the plurality of clock signals to the scan line of a respective one of the function blocks.

At least one of the above and other features and advantages of the invention may be realized by providing a method for testing an SOC, including providing scan chains, each adapted to conduct scan test operations in sync with a respective one of a plurality of clock signals having a different phase relative to each other, to a plurality of function blocks, and respectively supplying the plurality of clock signals to the scan chains to test combination circuits of the function blocks during an isolation mode, and to test combination circuits between the adjacent ones of the function blocks during an interface mode.

Respectively supplying comprises supplying respective ones of the plurality of clock signals to the scan chains such that each of the function blocks tests a combination circuit thereof or a combination circuit adjacent thereto based on a respective one of the plurality of clock signals. The method may further include sequentially generating the plurality of clock signals based on a system clock.

The scan chain of each of the functional blocks is adapted to operate in response to a respective one of the plurality of clock signals having a different phase. The scan chains are multi-scan chains. Each of the function blocks includes a plurality of the scan chains.

At least one scan chain of each function block may operate to test the combination circuit of the respective function block in response to a clock signal of a first phase and operate to test the combination circuit adjacent to and outside of the respective function clock in response to a clock signal of a second phase, wherein the first phase is different form the second phase.

Each function block may operate in an isolation mode and an interface mode based on a phase of a clock signal supplied thereto.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
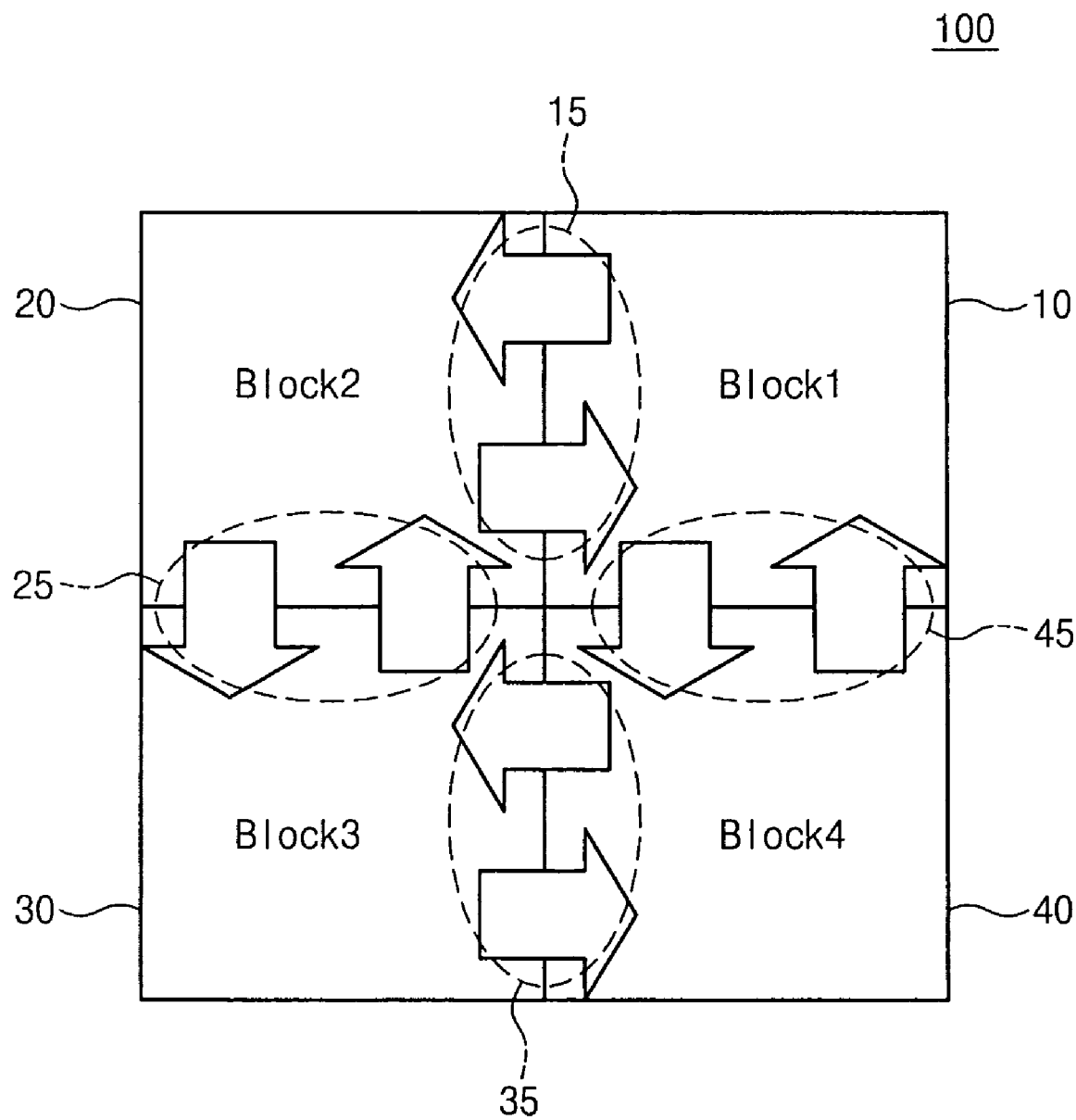
FIG. 1 illustrates a diagram of an exemplary configuration of an SOC according to an exemplary embodiment of the present invention.
Figure 1:
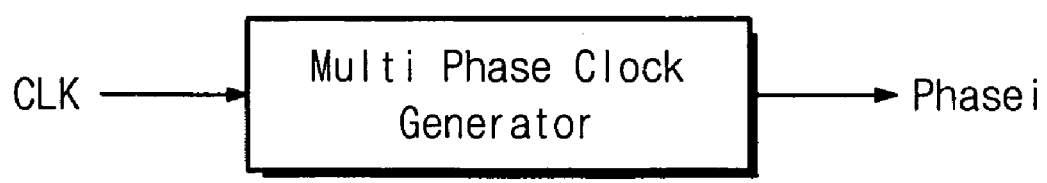

Korean Patent Application No. 10-2007-18582, filed on Feb. 23, 2007, in the Korean Intellectual Property Office, and entitled: "System-On-Chip Performing Multi-Phase Scan Chain and Method Thereof," is incorporated by reference herein in its entirety.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In addition, it will be understood that when an element is referred to as being "between" two elements, it can be the only element between the two elements, or one or more intervening elements may also be present. Like reference numerals refer to like elements throughout the specification.

Figure 2:
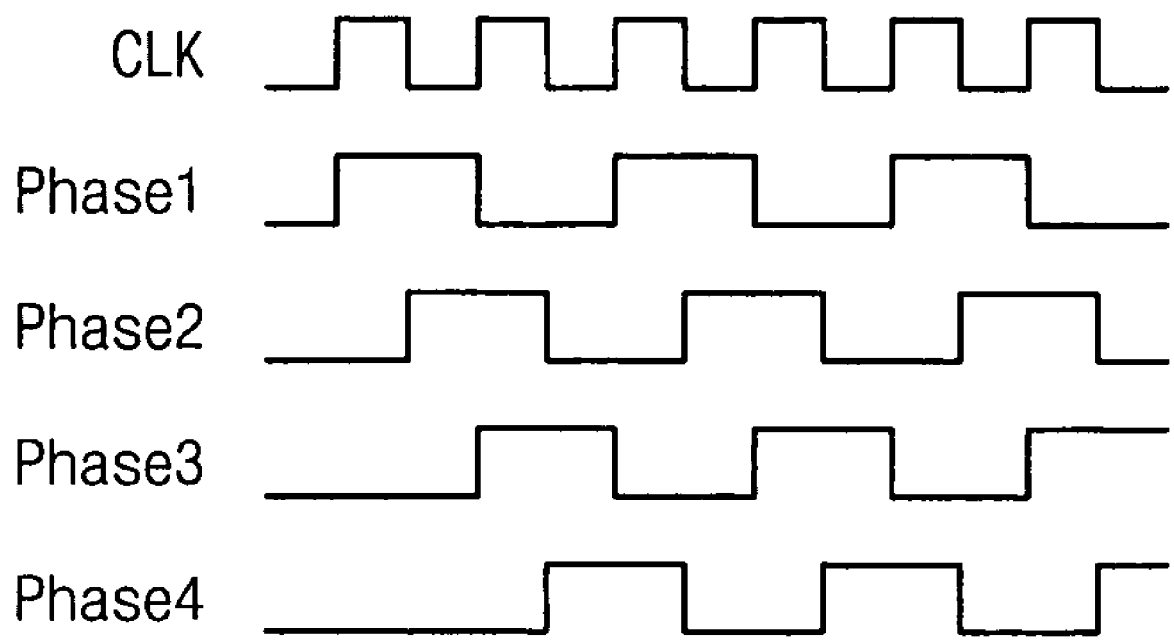
FIG. 2 illustrates an exemplary timing diagram of clock signals for respective blocks of the SOC illustrated in FIG. 1.
Figure 3:
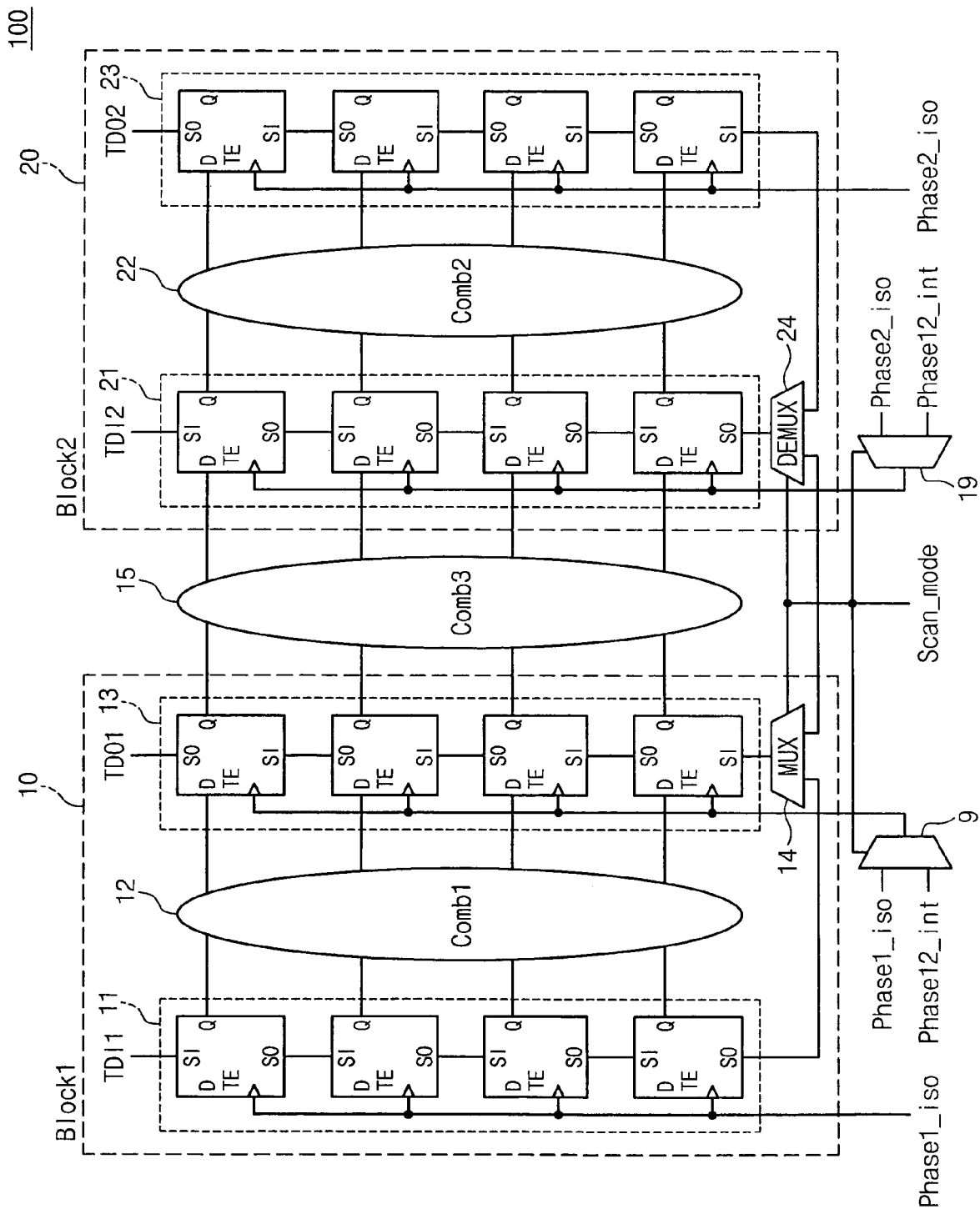
FIG. 3 illustrates a block diagram of exemplary scan chains of the first and second blocks illustrated in FIG. 1.

FIG. 1 illustrates a diagram of an exemplary configuration of a system on chip (an SOC) 100 according to an exemplary embodiment of the present invention. FIG. 2 illustrates an exemplary timing diagram of clock signals employable for driving first, second, third and fourth blocks 10, 20, 30, 40 of the SOC 100 illustrated in FIG. 1. FIG. 3 illustrates a block diagram of exemplary scan chains 11, 13, 21, 23 of the first and second blocks 10, 20 illustrated in FIG. 1.

The SOC 100 may include a plurality of blocks. For example, the SOC 100 may include the first block 10, the second block 20, the third block 30, the fourth block 40, an interface block 15 between the first block 10 and the second block 20, an interface block 25 between the second block 20 and the third block 30, an interface block 35 between the third block 30 and the fourth block 40, and an interface block 45 between the fourth block 40 and the first block 10.

Each of the first, second, third and fourth blocks 10, 20, 30, 40 of the SOC 100 may include a scan chain(s). For example, as shown in FIG. 3, in some embodiments, each of the blocks may include two scan chains. That is, e.g., the first block 10 may include the first scan chain 11 and the second scan chain 13, and the second block 20 may include the third scan chain 21 and the fourth scan chain 23.

During a scan test mode, if the first, second, third, and fourth chains 11, 13, 21, 23 operate according to clock signals having a same phase, the SOC 100 may experience a voltage drop when all the scan chains operate. Thus, the SOC 100 may fail in response to a normal scan test vector.

Accordingly, in embodiments of the invention, as shown, e.g., in FIGS. 1-3, the SOC 100 may be designed to operate according to clock signals of different phases during a scan test mode. As shown in FIG. 1, the SOC 100 may include a multi-phase clock generator for generating clock signals of different phases. More particularly, referring to FIG. 2, the multi-phase clock generator may sequentially generate a plurality of clock signals based on a system clock.

For example, the multi-phase clock generator may generate a first phase clock Phase1, a second phase clock Phase2, a third phase clock Phase3, and a fourth phase clock Phase4. More particularly, as shown in FIG. 2, e.g., the different phase clocks Phase1, Phase2, Phase3, Phase4 may not coincide with each other.

In embodiments, the blocks 10, 20, 30, 40 of the SOC 100 may operate according to respective clock signals of different phases. In some embodiments, each of the blocks 10, 20, 30, 40 may operate based on a clock signal of a different phase. More particularly, in some embodiments, e.g., at least one scan chain of each of the blocks 10, 20, 30, 40 may be associated with a respective one of the first, second, third and fourth phase clocks Phase1, Phase2, Phase3, Phase4. As such, the first block 10 may operate in response to the first phase clock Phase1, the second block 20 may operate in response to the second phase clock Phase2, the third block 30 may operate in response to the third phase clock Phase3, and the fourth block 40 may operate in response to the fourth phase clock Phase4.

Referring to FIG. 3, more particularly, the SOC 100 may include the first block 10, a clock Phase1_iso line, a first clock multiplexer 9, a third combination circuit (i.e., the interface block) 15, the second block 20, a clock Phase2_iso line, a Scan_mode line, and a second clock multiplexer 19.

The first block 10 may include the first scan chain 11, a first combination circuit 12, the second scan chain 13, and a scan chain multiplexer 14.

The second block 20 may include the third scan chain 21, a second combination circuit 22, the fourth scan chain 23, and a scan chain demultiplexer 24.

Each of the scan chains 11, 13, 21, 23 may include a plurality of flip flops coupled together, e.g., sequentially coupled together. In some embodiments, some of the scan chains, e.g., 13, 21 may be coupled to a plurality of the combination circuits. For example, the scan chains 13, 21 may be coupled to an adjacent combination circuit, e.g., the third combination circuit 15, and another of the combination circuits, e.g., the first combination circuit 12 and the second combination circuit 22, respectively.

The scan chains of the SOC 100 may be arranged according to blocks. For example, the first block 10 may test the first combination circuit 12 in connection with the first and second scan chains 11 and 13. The second block 20 may test the second combination circuit 22 in connection with the third and fourth scan chains 21 and 23. The scan chains 11, 13, 21, 23 may output test results to respective test data output lines TDI1, TD01, TDI2, TD02, etc.

In some embodiments, scan test operations of the SOC 100 may include an isolation mode and/or an interface mode. Referring to FIG. 3, the SOC 100 may select the isolation mode or the interface mode in response to a scan mode signal Scan_mode.

Figure 4:
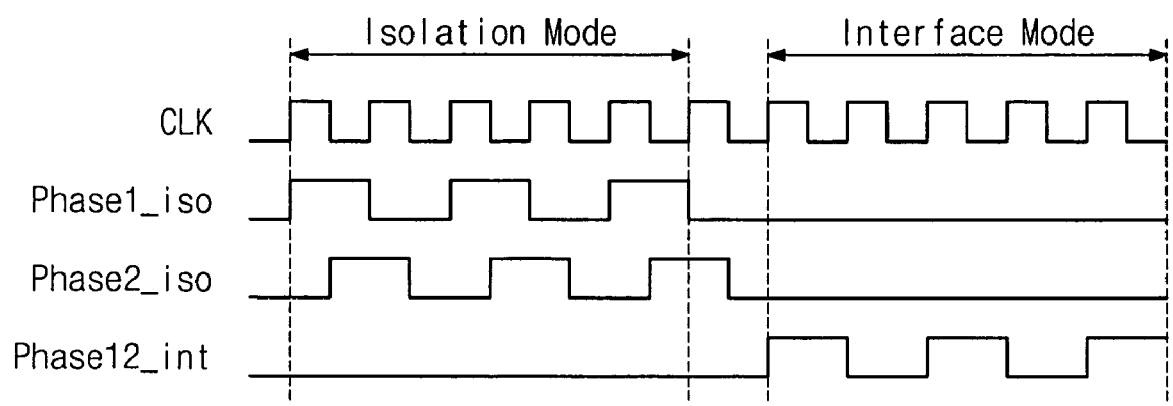
FIG. 4 illustrates an exemplary timing diagram of an isolation mode and an interface mode for the multi-phase scan chain illustrated in FIG. 3.

FIG. 4 illustrates an exemplary timing diagram of an isolation mode and an interface mode for the multi-phase scan chains 11, 13, 21, 23 illustrated in FIG. 3.

During the isolation mode, the scan chain(s) may test the combination circuit included in each block. For example, during the isolation mode, the first and second scan chains 11, 13 may be employed to test the first combination circuit 12 in the first block 10. As shown in FIG. 4, for the exemplary embodiment illustrated in FIG. 3, during the isolation mode a Phase12_int signal may not be supplied while a Phase1_iso signal and a Phase2_iso signal may be supplied. Further, as shown in FIG. 4, the Phase1_iso signal and the Phase2_iso signal may be out of phase relative to each other.

During the interface mode, the scan chain(s) may test the combination circuit outside of, e.g., adjacent to, the respective blocks. For example, during the interface mode, the second and third scan chains 13, 21 may test the third combination circuit (i.e., the interface block) 15. As shown in FIG. 4, for the exemplary embodiment illustrated in FIG. 3, during the interface mode the Phase1_iso signal and the Phase2_iso signal may not be supplied while the Phase 12_int signal may be supplied.

Figure 5:
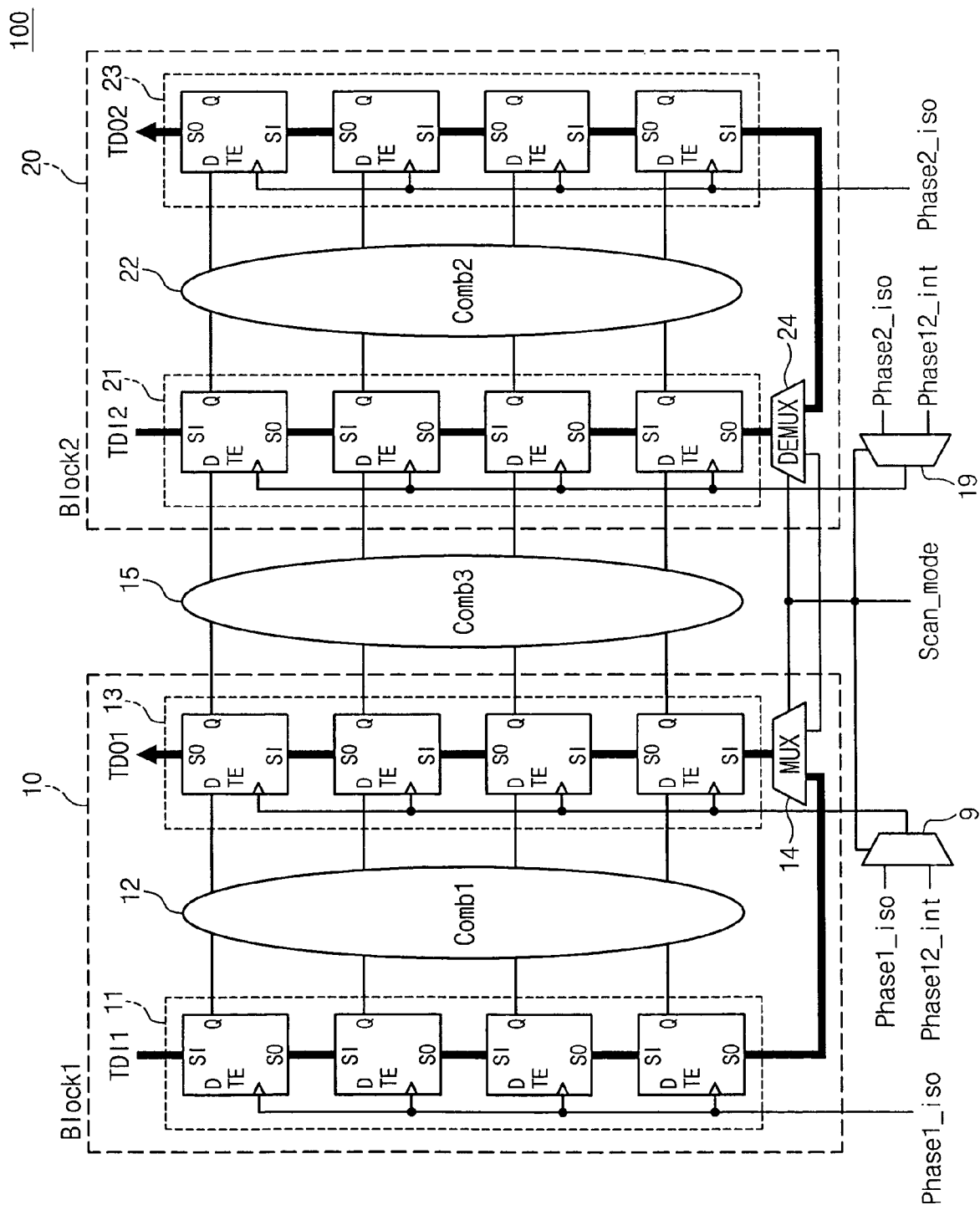
FIG. 5 illustrates a block diagram the first and second blocks of FIG. 3 in an isolation mode.

More particularly, in the isolation mode, as shown, e.g., in FIG. 5, the first scan chain 11 may be connected to the second scan chain 13 in the first block 10, and the third scan chain 21 may be connected to the fourth scan chain 23 in the second block 20. In the interface mode, as shown, e.g., in FIG. 6, the second scan chain 13 of the first block 10 may be connected to the third scan chain 21 of the second block 20.

FIG. 5 illustrates a block diagram of the first and second blocks 10, 20 of FIG. 3 in the isolation mode.

Referring FIGS. 4 and 5, in response to an isolation mode scan signal supplied to the Scan_mode line of the SOC 100, the SOC may operate in an isolation mode. In the isolation mode, in the first block 10, the first scan chain 11 may be connected to the second scan chain 13, and in the second block 20, the third scan chain 21 may be connected to the fourth scan chain 23. The scan chains 11, 13 of the first block 10 may operate in sync with the Phase1_iso signal supplied to a terminal of the first clock multiplexer 9. The scan chains 21, 23 of the second block 20 may operate in sync with the Phase2_iso signal supplied to a terminal of the second clock multiplexer 19. Referring to FIG. 4, the Phase1_iso signal may have a different phase than the Phase2_iso signal.

Accordingly, during the isolation mode, the scan chains 11, 13 of the first block 10 may operate to test the first combination circuit 12, and the scan chains 21, 23 of the second block 20 may operate to test the second combination circuit 22.

Figure 6:
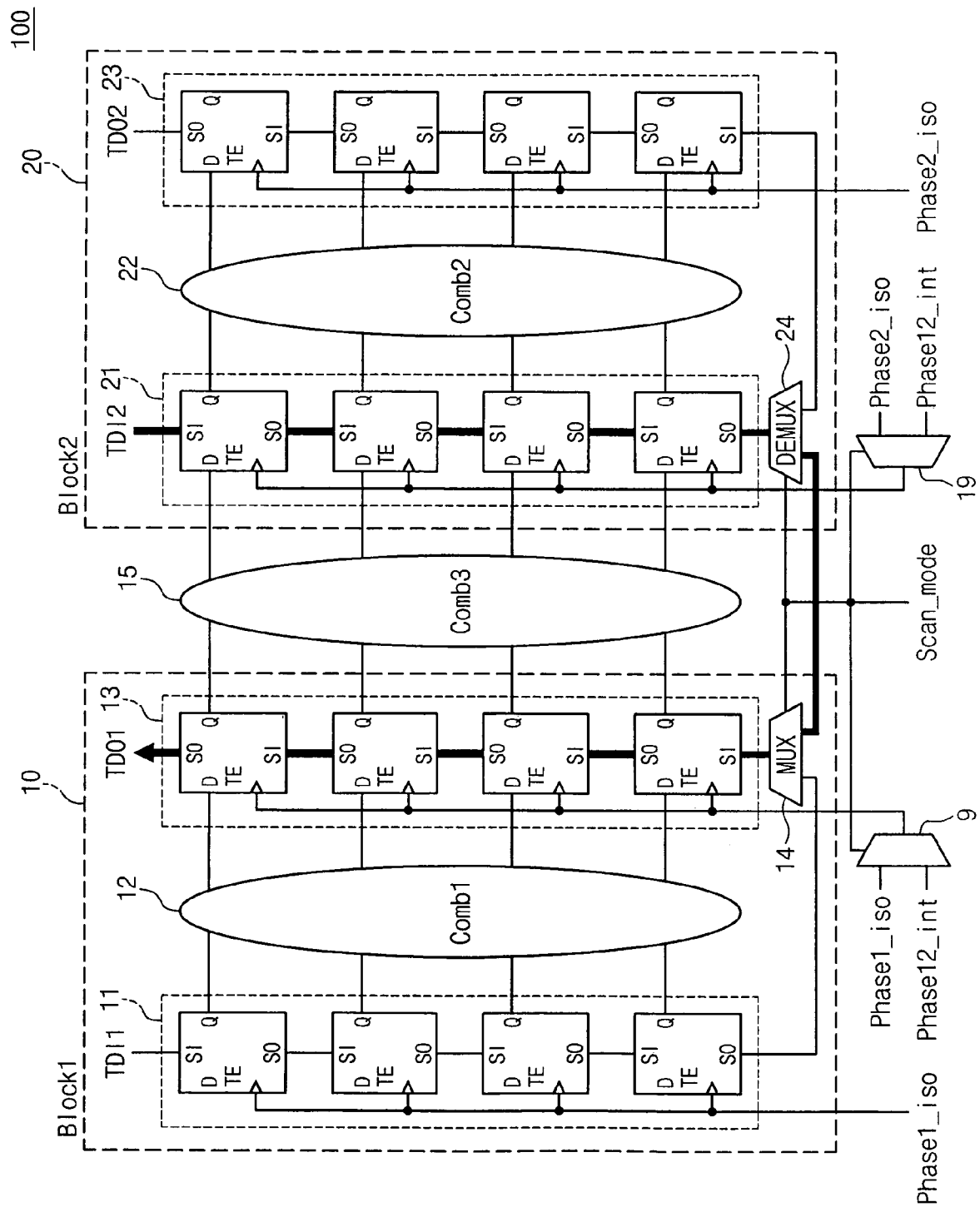
FIG. 6 illustrates a block diagram of the first and second blocks of FIG. 3 in an exemplary interface mode.

FIG. 6 illustrates a block diagram of the first and second blocks of FIG. 3 in an exemplary interface mode.

In response to, e.g., an interface mode scan signal supplied to the Scan_mode line of the SOC 100, the SOC may operate in the interface mode. During the interface mode, the second scan chain 13 of the first block 10 may be connected to the third scan chain 21 of the second block 20. The second scan chain 13 of the first block 10 and the third scan chain 21 of the second block 20 operate in sync with the interface clock Phase12_int signal supplied to the first and second clock multiplexers 9, 19.

Accordingly, during the interface mode, the second scan chain 13 of the first block 10 and the third scan chain 21 of the second block 20 may be used to test the third combination circuit 15.

Figure 7:
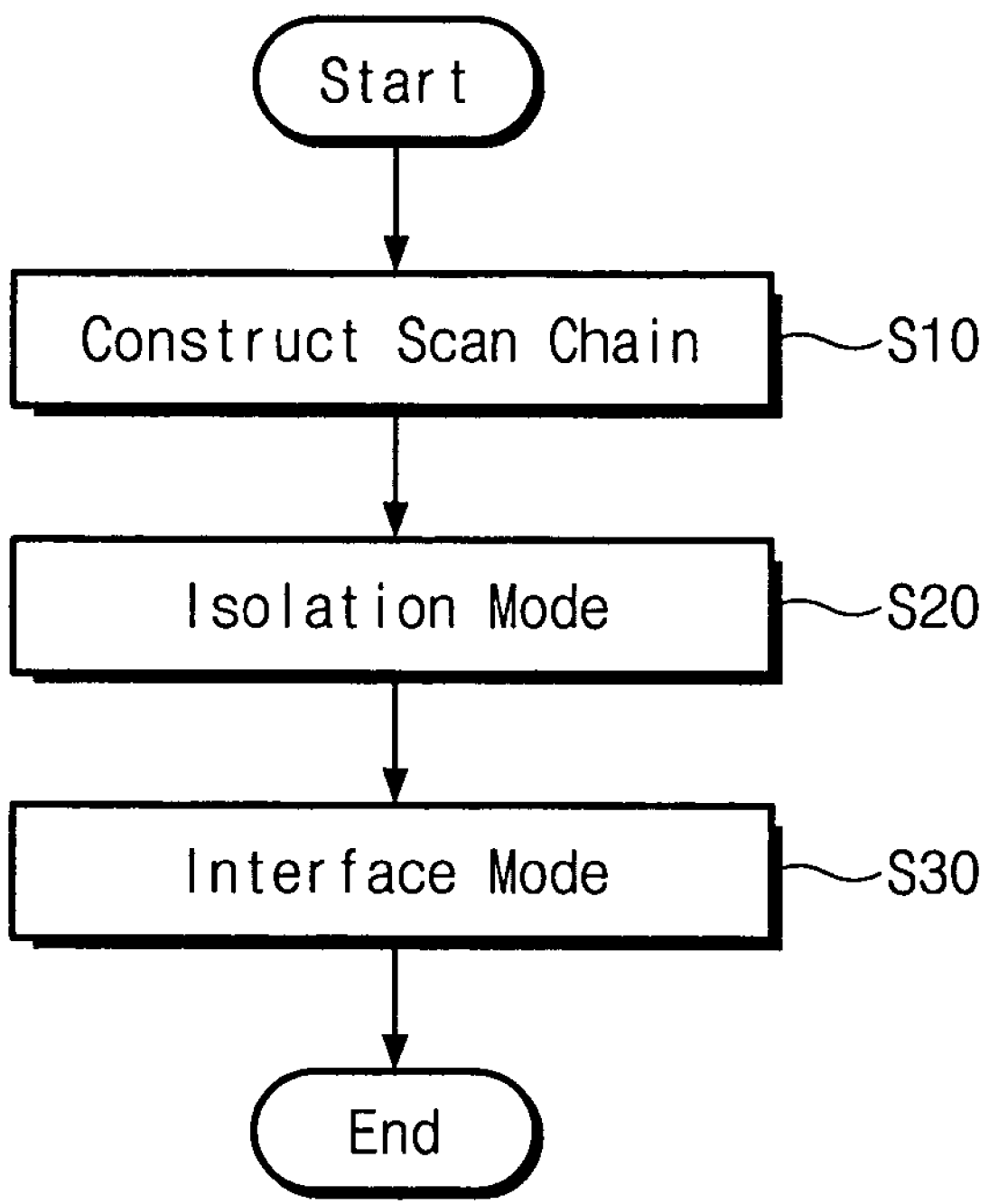
FIG. 7 illustrates a flow chart of an exemplary scan test method of the multi-phase scan chain according to an exemplary embodiment of the present invention.

FIG. 7 illustrates a flow chart of an exemplary scan test method of a multi-phase scan chain according to an exemplary embodiment of the present invention.

Referring to FIG. 7, a scan chain may be constructed (step S10). Then, each block may be individually tested during an isolation mode (step S20). Further, adjacent or related ones of the blocks may be tested during an interface mode (step S30).

As described above, embodiments of the invention may prevent and/or reduce failures due to a scan chain vector, by employing scan chains operating in multiple phases. Embodiments of the invention may provide a scan chain system capable of being operated without a transient voltage drop even in a multi-scan chain mode.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A system on chip (SOC), comprising:
   function blocks; and
   at least one scan chain in each of the function blocks, the scan chain being adapted to conduct scan test operations in sync with a respective one of a plurality of clock signals having a different phase relative to each other,
   wherein:
   during an isolation mode, the scan chains test combination circuits of the function blocks,
   during an interface mode, the scan chains of adjacent ones of the function blocks test combination circuits between the adjacent ones of the function blocks,
   the at least one scan chain of each function block is adapted to test the combination circuit of the respective function block and the combination circuit adjacent to and outside of the respective function block, and
   the SOC is adapted to operate in the isolation mode or the interface mode in response to a scan mode signal.

2. The SOC as claimed in claim 1, further comprising a multi-phase clock generator adapted to sequentially generate the plurality of clock signals based on a system clock.

3. The SOC as claimed in claim 1, wherein the scan chain of each of the functional blocks is adapted to operate in response to a respective one of the plurality of clock signals having a different phase.

4. The SOC as claimed in claim 1, wherein the scan chains are multi-scan chains.

5. The SOC as claimed in claim 1, wherein each of the function blocks includes a plurality of scan chains.

6. The SOC as claimed in claim 1, wherein the at least one scan chain of each function block operates to test the combination circuit of the respective function block in response to a clock signal of a first phase and operates to test the combination circuit adjacent to and outside of the respective function clock in response to a clock signal of a second phase, wherein the first phase is different form the second phase.

7. The SOC as claimed in claim 1, wherein each function block is adapted to operate in an isolation mode and an interface mode based on a phase of a clock signal supplied thereto.

8. The SOC as claimed in claim 1, further comprising a multiplexer adapted to selectively supply one of respective ones of the plurality of clock signals to the scan line of a respective one of the function blocks.

9. A method for testing an SOC, comprising:
   providing scan chains, each adapted to conduct scan test operations in sync with a respective one of a plurality of clock signals having a different phase relative to each other, to a plurality of function blocks, each of the function blocks including at least one scan chain;
   respectively supplying the plurality of clock signals to the scan chains to test combination circuits of the function blocks during an isolation mode, and to test combination circuits between the adjacent ones of the function blocks during an interface mode, operating the SOC in the isolation mode or the interface mode in response to a scan mode signal, wherein:

the at least one scan chain of each function block operates to test the combination circuit of the respective function block in response to a clock signal of a first phase, and operates to test the combination circuit adjacent to and outside of the respective function clock in response to a clock signal of a second phase, wherein the first phase is different form the second phase.

10. The method as claimed in claim 9, wherein respectively supplying comprises supplying respective ones of the plurality of clock signals to the scan chains such that each of the function blocks tests a combination circuit thereof or a combination circuit adjacent thereto based on a respective one of the plurality of clock signals.

11. The method as claimed in claim 9, further comprising sequentially generating the plurality of clock signals based on a system clock.

12. The method as claimed in claim 9, wherein the scan chain of each of the functional blocks is adapted to operate in response to a respective one of the plurality of clock signals having a different phase.

13. The method as claimed in claim 9, wherein the scan chains are multi-scan chains.

14. The method as claimed in claim 9, wherein each of the function blocks includes a plurality of the scan chains.

15. The method as claimed in claim 9, wherein each function block operates in an isolation mode and an interface mode based on a phase of a clock signal supplied thereto.

* * * * *